United States Patent
Huang et al.

(10) Patent No.: US 11,404,331 B2
(45) Date of Patent: Aug. 2, 2022

(54) SYSTEM AND METHOD FOR DETERMINING CAUSE OF ABNORMALITY IN SEMICONDUCTOR MANUFACTURING PROCESSES

(71) Applicant: Vanguard International Semiconductor Corporation, Hsinchu (TW)

(72) Inventors: Syuan-Rong Huang, Chiayi County (TW); Chien-Huei Yang, Taoyuan (TW); Chun-Fu Tung, Hsinchu (TW); Hua-Ming Wang, Hsinchu County (TW); Yung-Cheng Chang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 295 days.

(21) Appl. No.: 16/916,091

(22) Filed: Jun. 29, 2020

(65) Prior Publication Data

US 2021/0407866 A1 Dec. 30, 2021

(51) Int. Cl.
*H01L 21/00* (2006.01)
*H01L 21/66* (2006.01)
*H01L 21/67* (2006.01)

(52) U.S. Cl.
CPC ........ *H01L 22/26* (2013.01); *H01L 21/67288* (2013.01); *H01L 22/12* (2013.01); *H01L 22/20* (2013.01)

(58) Field of Classification Search
CPC ......... H01L 22/12; H01L 22/20; H01L 22/26; H01L 21/67288
See application file for complete search history.

(56) References Cited

U.S. PATENT DOCUMENTS

| 6,580,960 B1* | 6/2003 | Nicholson | H01L 22/20 |
| | | | 700/121 |
| 6,701,204 B1* | 3/2004 | Nicholson | H01L 22/20 |
| | | | 700/121 |

(Continued)

FOREIGN PATENT DOCUMENTS

| JP | 2012-15410 | 1/2012 |
| TW | I390649 | 3/2013 |
| TW | 201910795 A | 3/2019 |

*Primary Examiner* — Mounir S Amer
*Assistant Examiner* — Alexander Belousov
(74) *Attorney, Agent, or Firm* — Winston Hsu

(57) ABSTRACT

A system for determining the cause of an abnormality in a semiconductor manufacturing process includes an abnormality mode determination module, a selection module, and a root cause analysis module. The abnormality mode determination module is used to determine the similarity between wafer bin maps containing the abnormal data. When the similarity among the wafer maps is higher than a reference value, the selection module executes the steps of: determining a bad lot based on the wafer maps where the similarity is higher than the reference value; determining a time span within which the bad lot is generated; selecting other bad lots occurring in the time span and satisfying a failure model; selecting a good lot based on a fixed lot interval. The root cause analysis module is used to execute the steps of calculating the correlation among data to obtain confidence indexes.

20 Claims, 10 Drawing Sheets

(56) References Cited

U.S. PATENT DOCUMENTS

| | | | | |
|---|---|---|---|---|
| 7,221,991 | B2* | 5/2007 | Matsushita | G05B 23/0248 |
| | | | | 700/121 |
| 7,426,016 | B2* | 9/2008 | Takada | G03F 9/7026 |
| | | | | 355/53 |
| 7,599,817 | B2* | 10/2009 | Matsushita | H01L 22/20 |
| | | | | 702/35 |
| 8,627,251 | B2* | 1/2014 | Chen | H01L 22/20 |
| | | | | 716/112 |
| 8,938,698 | B2* | 1/2015 | Chen | H01L 22/20 |
| | | | | 716/54 |
| 9,165,843 | B2* | 10/2015 | Chen | H01L 22/20 |
| 11,263,737 | B2* | 3/2022 | Sawlani | G06T 7/0004 |
| 2003/0027362 | A1* | 2/2003 | Yang | H01L 22/20 |
| | | | | 257/E21.525 |
| 2004/0122859 | A1* | 6/2004 | Gavra | H01L 22/20 |
| 2005/0194590 | A1* | 9/2005 | Matsushita | G05B 23/0248 |
| | | | | 438/15 |
| 2006/0095237 | A1* | 5/2006 | Wang | H01L 22/20 |
| | | | | 703/2 |
| 2006/0281199 | A1* | 12/2006 | Matsushita | G05B 23/024 |
| | | | | 257/E21.525 |
| 2008/0129978 | A1* | 6/2008 | Takada | G03F 9/7034 |
| | | | | 355/77 |
| 2013/0288403 | A1* | 10/2013 | Chen | H01L 22/20 |
| | | | | 700/110 |
| 2014/0106474 | A1* | 4/2014 | Chen | H01L 22/20 |
| | | | | 29/25.01 |
| 2015/0125970 | A1* | 5/2015 | Chen | H01L 22/10 |
| | | | | 438/14 |
| 2020/0226742 | A1* | 7/2020 | Sawlani | G06T 7/0004 |
| 2021/0407866 | A1* | 12/2021 | Huang | H01L 22/26 |

* cited by examiner

SYSTEM AND METHOD FOR DETERMINING CAUSE OF ABNORMALITY IN SEMICONDUCTOR MANUFACTURING PROCESSES

BACKGROUND OF THE INVENTION

1. Field of the Invention

The present disclosure relates to a system and method for determining the cause of abnormality in a semiconductor manufacturing process, and more particularly to a system and method for automatically determining the cause of abnormality in a semiconductor manufacturing process.

2. Description of the Prior Art

For semiconductor devices, after the wafers complete the front-end-of-line and back-end-of-line semiconductor manufacturing processes, the wafers would be further diced into multiple chips, which would be further packaged in the following processes.

Specifically, when there is a systematic failure in a semiconductor manufacturing process leading to a decrease in the yield of the wafers, the wafer maps of the corresponding wafer lots may show similar failure patterns. The types of the failure patterns may include center pattern, edge pattern, ring pattern, radiation pattern, donut pattern, and so forth. By examining the failure patterns shown in the wafer maps, engineers could, based on their experience, manually set the screening conditions for each processing parameter in the engineering data analysis system in order to find the main reason (or the root cause of the abnormality) of the reduction in wafer yield. The root cause may include mechanism-related root cause, particle-related root cause, process-related root cause, and equipment-related root cause, but not limited thereto.

However, numerous data and parameters have to be considered during the process of determining the root cause of the abnormality. These data and information include, but not limited thereto, pressure, temperature, processing duration, and vent for each equipment. Thus, the determination process relies heavily on personal experience (domain knowledge), manpower and time. In addition, when experienced engineers leave, their related experience usually could not effectively pass to junior engineers, which is another reason why the root cause of abnormality in the semiconductor manufacturing process is difficult to be determined quickly. In view of this, there is still a need to develop a system and method for determining the root cause of abnormality in semiconductor manufacturing processes to overcome the aforementioned drawbacks.

SUMMARY OF THE INVENTION

In view of this, the present disclosure provides a system and method for determining the root cause of abnormality in semiconductor manufacturing processes to overcome the aforementioned technical drawbacks in prior art.

According to one embodiment of the present disclosure, a system for determining the cause of abnormality in a semiconductor manufacturing processes includes an abnormality mode determination module, a selection module, and a root cause analysis module. The abnormality mode determination module is used to record a plurality of abnormal data generated in circuit probing process, determine the similarity between wafer bin maps containing the abnormal data, and determine whether the similarity between the wafer maps is higher than a reference value. When the similarity among the wafer maps is higher than a reference value, the selection module executes the steps of: determining a bad lot based on the wafer maps where the similarity is higher than the reference value; determining a time span within which the bad lot is generated; selecting at least one other bad lot occurring in the time span and satisfying a failure model; selecting at least two good lot based on a fixed lot interval. The root cause analysis module is used to execute the steps of: retrieving a plurality of corresponding abnormal data from a database based on the at least one other bad lot and the at least two good lots selected by the selection module; calculating a plurality of correlation coefficients based on the relationship between the abnormal data and a plurality of process analysis results corresponding to the at least one other bad lot; calculating a plurality of confidence indexes based on the correlation coefficients; and arranging the confidence indexes in an order based on numerical values of the confidence indexes.

According to one embodiment of the present disclosure, a method for determining the cause of abnormality in a semiconductor manufacturing process includes the following steps: using a plurality of abnormal data acquired by a measurement to determine a similarity between wafer maps respectively corresponding to the abnormal data; determining whether the similarity between the wafer maps is higher than a reference value; executing a selection step for sorting good lot/bad lots when the similarity between the wafer maps is higher than the reference value, where the selection step includes the steps of: determining a time span within which the at least two bad lots are generated; obtaining a failure module corresponding to the at least two bad lots; selecting at least one further bad lot occurring in the time span and fitting the failure model; and selecting at least two good lots based on a fixed lot interval in the time span; and executing a root cause analysis step after the selection step, where the root cause analysis step comprises the steps of: retrieving a plurality of corresponding abnormal data from a database based on the at least one further bad lot and the at least two good lots selected by the selection module; calculating a plurality of correlation coefficients based on the relationship between the abnormal data and a plurality of process analysis results corresponding to the at least one further bad lot; calculating a plurality of confidence indexes based on the correlation coefficients; and arranging the confidence indexes in an order based on numerical values of the confidence indexes.

According to the embodiments of the present disclosure, by using the abnormal mode determination module, the selection module, and the root cause analysis module, the steps, such as the step of determining abnormality mode, the step of selecting good lots/bad lots, and the step of determining root causes, may be executed automatically. Thus, the following treatment may be triggered automatically. In other words, according to the embodiments of the present disclosure, the step of determining abnormality mode, the step of selecting good lots/bad lots, and the step of determining root causes may not be executed manually. As a result, the root cause of the abnormality in the semiconductor manufacturing process may be determined quickly, and the subsequent treatment may also be triggered automatically.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

For more complete understanding of the present invention and its advantage, reference is now made to the following description, taken in conjunction with accompanying drawings, in which.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

The terms, such as "coupled to" and "electrically connected to", disclosed herein encompass all means of directly and indirectly electrical connection. For example, when an element or layer is referred to as being "coupled to" or "electrically connected to" another element or layer, it may be directly coupled or electrically connected to the other element or layer, or intervening elements or layers may be presented.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person of ordinary skill in the art.

Figure 1:
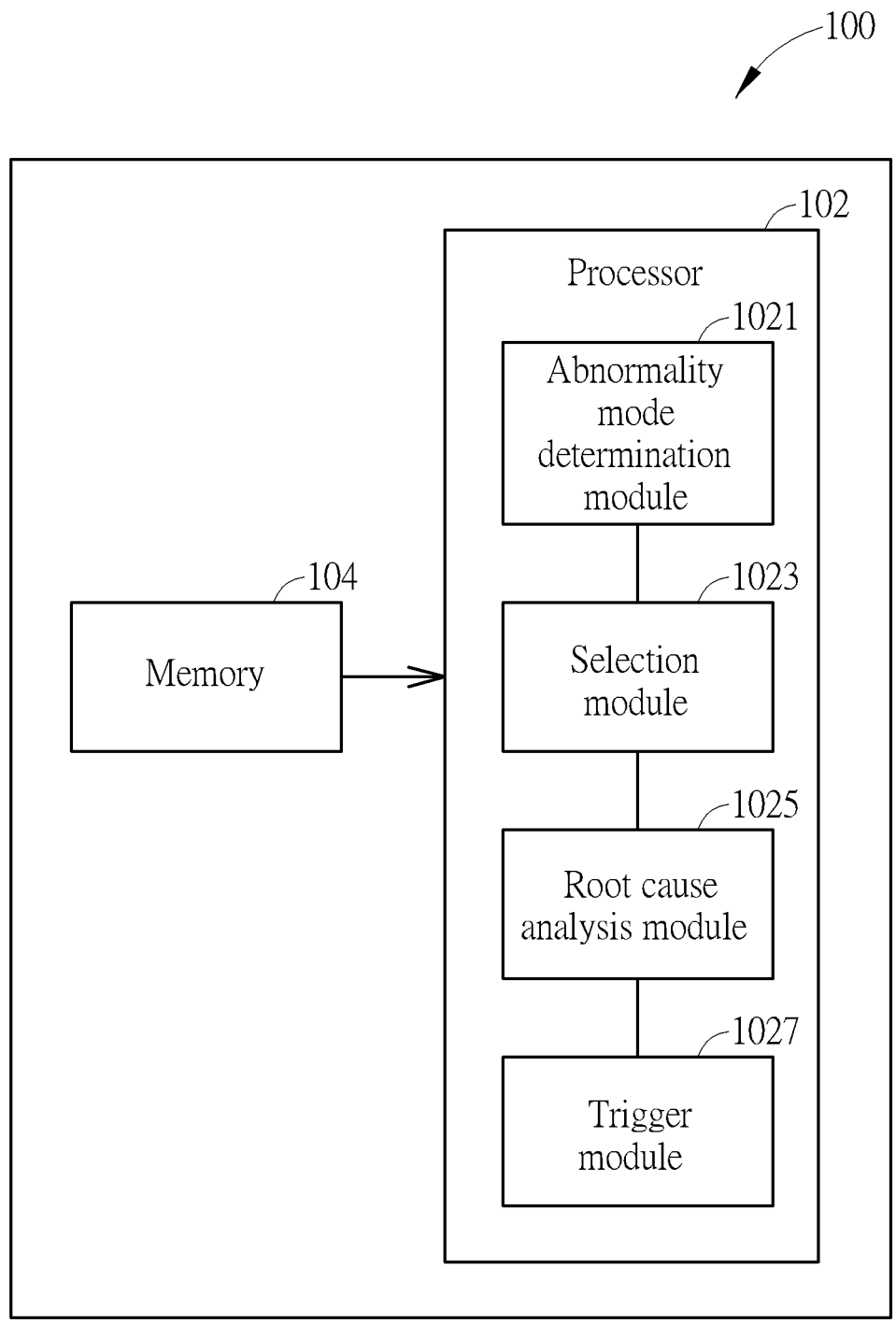
FIG. 1 is a block diagram of a system for determining a cause of abnormality in a semiconductor manufacturing process according to one embodiment of the present disclosure.

FIG. 1 is a block diagram of a system for determining a cause of abnormality of a semiconductor manufacturing process according to one embodiment of the present disclosure. Referring to FIG. 1, a system 100 for determining the cause of abnormality in semiconductor manufacturing processes may include at least one processor 102 and at least one memory device 104. The processor 102 is electrically coupled to the memory device 104. The processor 102 may be a central processing unit (CPU), a programmable microprocessor, an embedded control chip, and so forth. The memory device 104 is non-transitory computer readable medium, such as any type of stationary or movable random access memory (RAM), a read-only memory (ROM), a flash memory, a hard disc, other similar devices, or a combination thereof. A plurality of program code fragments are stored in the memory device 104. After the above code fragments are installed, the code fragments may be executed by the processor 102 to perform the method of determining the cause of the abnormality of the semiconductor manufacturing processes. The processor 102 may include multiple modules, and each of the modules may be, for example, a central processing unit (CPU), a programmable microprocessor, an embedded control chip, and the like. According to one embodiment of the present disclosure, the modules in the processor 102 may be, for example, an abnormality mode determination module 1021, a selection module 1023, a root cause analysis module 1025, and a trigger module 1027.

Figure 2:
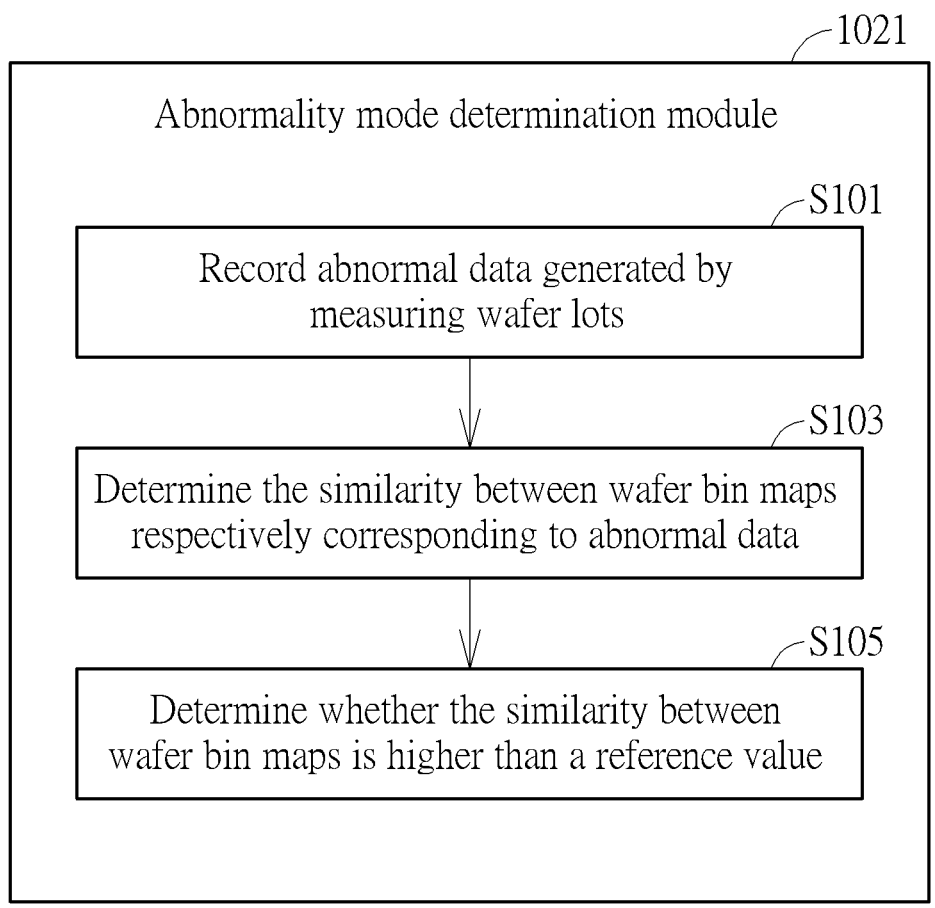
FIG. 2 is a block diagram of an abnormality mode determination module for executing an abnormality mode determination step according to one embodiment of the present disclosure.

FIG. 2 is a block diagram of an abnormality mode determination module for executing a step of determining abnormality mode according to one embodiment of the present disclosure. Referring to FIG. 2, for wafer lots that are obtained after a back-end-of-line (BEOL) processing, step S101 may be executed by the abnormality mode determination module 1021 to record or read abnormal data generated by measuring the wafer lots, such as abnormal data generated during an electrical measurement and/or an optical measurement, or multiple abnormal data generated during a circuit probing (CP) procedure. The abnormal data may be data representing a specific electrical characteristic and deviating from a predetermined value. Then, step S103 is executed to determine the similarity between the wafer bin maps corresponding to the abnormal data. For example, the similarity between one failure pattern constituted by the abnormal data of a given wafer or wafer lot and another failure pattern constituted by the abnormal data of another wafer or wafer lot is determined. Then, step S105 is executed to determine whether the similarity between wafer bin maps is higher than a reference value. For example, when the similarity between the wafer bin maps is higher than a similarity standard (i.e. a reference value), the failure pattern constituted by the abnormal data of a given wafer or wafer lot is regarded as similar to failure pattern constituted by the abnormal data of another wafer or wafer lot. For example, the failure patterns of the wafers or wafer lots may include donut patterns. When the abnormality mode determination module 1021 determines that the similarity between the wafer bin maps is higher than the similarity standard, the abnormality mode determination module 1021 may determine that there is a systematic detect, and the corresponding abnormal data may be stored in a database used to storing abnormal cases. In another embodiment, in either one of a back-end-of-line (BEOL) processing stage and a middle-end-of-line (MEOL) processing stage, non-electrical measurement methods, such as an optical measurement, may be used to obtain abnormal data. The method of acquiring abnormal data may be decided based on the needs of those skilled in the art, and should not be limited to the method disclosed above. Besides, the wafer maps corresponding to the abnormal data may be, for example, wafer bin maps or particle defect maps.

Figure 3:
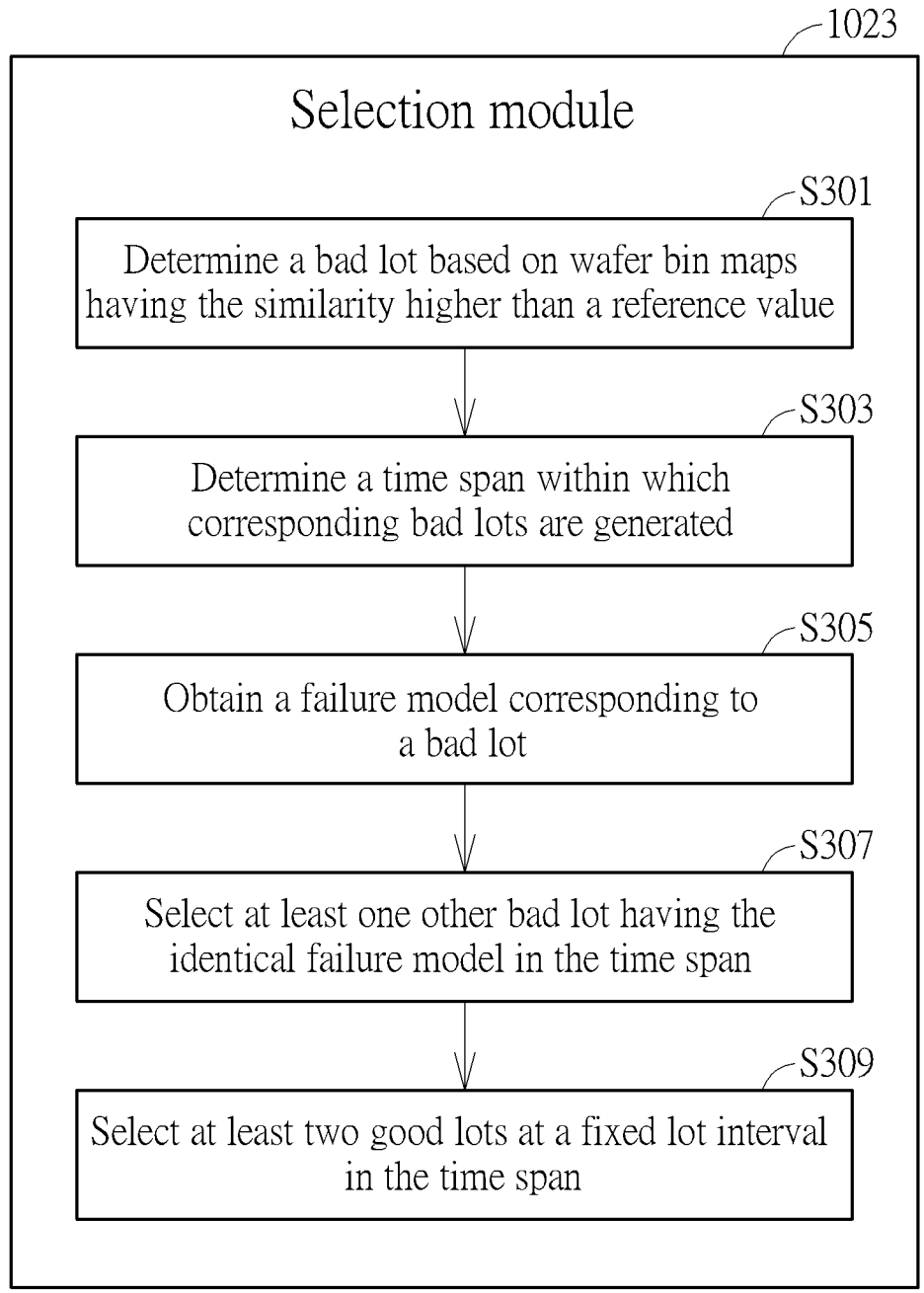
FIG. 3 is a block diagram of a selection module for executing a selection step according to one embodiment of the present disclosure.

FIG. 3 is a block diagram of a selection module for executing a selection step according to one embodiment of the present disclosure. Referring to FIG. 3, when the similarity between the wafer bin maps is higher than the similarity standard (or a reference value), the selection module 1023 may execute step S301 to determine the bad lot based on the wafer bin maps having the similarity higher than the similarity standard. Next, the selection module 1023 may execute step S303 to determine a time span within which the above bad lots are generated. The time span may be determined based on the time at which a first batch of the bad lots and the time at which a last batch of the bad lots, as well as buffer time for inspection. Then, the selection module 1023 may execute step S305 to obtain a failure model corresponding to the above-mentioned bad lot, and the failure model may be determined based on spatial distribution of a failure pattern in the wafer bin maps or types of fail bins. Afterwards, the selection module 1023 may execute step S307 to select at least one other bad lot having the identical failure model within the time span. Afterwards, the selection module 1023 may execute step S309 to select at least two good lots at a fixed lot interval in the time span. When more good lots are selected during step S309, for example, more than 5 good lots, the result of the subsequent root cause analysis may be more accurate, but the number of the lots is not limited thereto. In addition, when the ratio of the number of bad lots to the number of good lots falls within a certain ratio, such as 1:3 to 1:4, it may be more conducive to the subsequent root cause analysis.

Figure 4:
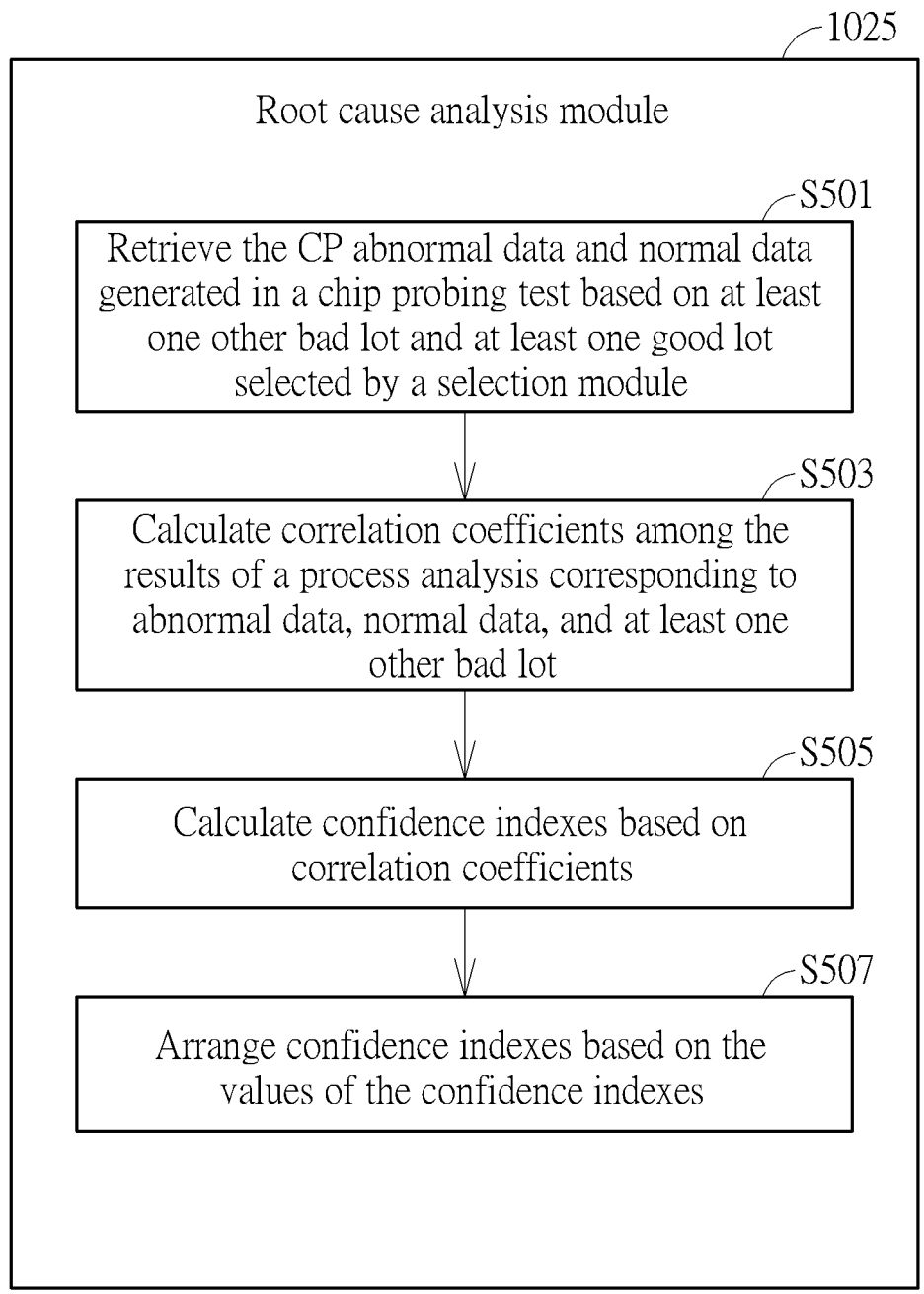
FIG. 4 is a block diagram of a root cause analysis module for executing a root cause analysis step according to one embodiment of the present disclosure.

FIG. 4 is a block diagram of a root cause analysis module for executing a root cause analysis step according to one embodiment of the present disclosure. Referring to FIG. 4, after the selection module 1023 select the bad lot and good lot, the root cause analysis module 1025 may then execute step S501, based on the bad lot and good lot selected by the selection module 1023, to retrieve the CP abnormal data and normal data generated in a chip probing test based on the at least one further bad lot and the at least one good lot selected (or sorted) by the selection module 1023. Afterwards, the root cause analysis module 1025 executes step S503 to calculate the correlation coefficients among the results of the process analysis corresponding to the CP abnormal data, the normal data, and the at least one other bad lot. The results of the process analysis may refer to the results generated based on analyzing equipment log (EQP), lot quality control (LQC), real time management (RTM), wafer acceptance test (WAT), and so forth. Regarding the method of calculating the correlation coefficients, according to one embodiment of the present disclosure, the method may consider the relation between CP and EQP, the relation between CP and LQC, and the relation between CP and RTM, but not limited thereto. For the analysis between CP and EQP, it may calculate the possibility that a root cause is attributed to given equipment. The possibility may be presented in the form of numerical values (such as correlation coefficients). Similarly, for the analysis between CP and LQC, it also calculates the probability that a root cause is attributed to given equipment. The possibility may be presented in the form of numerical values (such as correlation coefficients). For the analysis between CP and LQC, it also uses an analogous calculation method. Next, step S505 is executed to calculate the confidence indexes (CI) based on the correlation coefficients. The confidence indexes are numerical values (or probability value) from 0 to 1, and the higher the value of CI, the higher the probability that the corresponding equipment may be attributed to the root cause. According to one embodiment of the present disclosure, the confidence indexes may be generated by the following equation (1):

$$CI = P(\text{logit}(p) > 0) \quad (1)$$

With respect to equation (1), logit (p) is the logarithm of an odds ratio (abbreviated as "OR") as expressed in equation (2):

$$\text{logit}(p) = \log\left(\frac{p}{1-p}\right) = ax_1 + bx_2 + cx_3 + dx_4 \ldots zx_n \quad (2)$$

With respect to equation (2), $$\frac{p}{1-p}$$

is an onus ratio (OR), where p represents the probability that given equipment is the root cause of the abnormality, and 1-p represents the probability that given equipment is not the root cause of the abnormality; $ax_1 + bx_2 + cx_3 + dx_4 \ldots zx_n$ in equation (2) is logistic regression, where a, b, c . . . z are weight coefficients, which may be generated or evaluated based on a model established by past abnormal data (for example, weight coefficients may be calculated based on correlation coefficients recorded in a database, and the correlation coefficients are obtained by analyzing the relation between CP and EQP, the relation between CP and LQC, and the relation between CP and RTM), and the weight coefficients may be changed with respect to the types and the number of the past abnormal data; n in $x_n$ is an integer greater than 1, and, with respect to one embodiment of the present disclosure, $x_1, x_2, x_3, x_4 \ldots x_n$ may respectively correspond to a correlation coefficient calculated based on the relation between CP and EQP, a correlation coefficient calculated based on the relation between CP and WAT, a correlation coefficient calculated based on the relation between CP and LQC, and a correlation coefficient calculated based on the relation between CP and RTM, but not limited thereto.

Afterwards, the root cause analysis module 1025 may execute step S507 to arrange the confidence indexes according to the value of the confidence indexes. In other words, when the value of CI in equation (1) is larger, the CI value may be ranked higher. For the values of CI that are higher than a preset value (for example, higher than 95%) and ranked higher, the root cause of the abnormality is more likely to be attributed to the corresponding equipment. For example, when the value of the CI for a given process equipment (such as heat treatment equipment) is ranked higher as a result of the Logistic regression calculation, the higher the probability that the specific process equipment is the root cause of abnormality.

Afterwards, according to one embodiment of the present disclosure, the trigger module 1027 in the system 100 for determining the cause of the abnormality in the semiconductor manufacturing process may transmit a specific signal, so that the given process equipment incurring the abnormality may take given actions based on the signal transmitted from the trigger module 1027. The actions may include automatic shutdown, automatic checking of equipment condition, automatic adjustment of process parameters, and so forth. According to another embodiment of the present disclosure, the trigger module 1027 may also transmit a specific signal to notify the engineer to manually perform shutdown, check the equipment condition, adjust the process parameters, and other manual actions on the specific equipment that incurs the abnormality.

According to the embodiments of the present disclosure, by using the abnormal mode determination module, the selection module, and the root cause analysis module, the steps, such as the step of determining abnormality mode, the step of selecting good lots/bad lots, and the step of determining root causes, may be executed automatically. Thus, the following treatment may be triggered automatically. In other words, according to the embodiments of the present disclosure, the step of determining abnormality mode, the step of selecting good lots/bad lots, and the step of determining root causes may not be necessarily executed manually. As a result, the root cause of the abnormality in the semiconductor manufacturing process may be determined quickly, and the subsequent treatment may also be triggered automatically.

Figure 5:
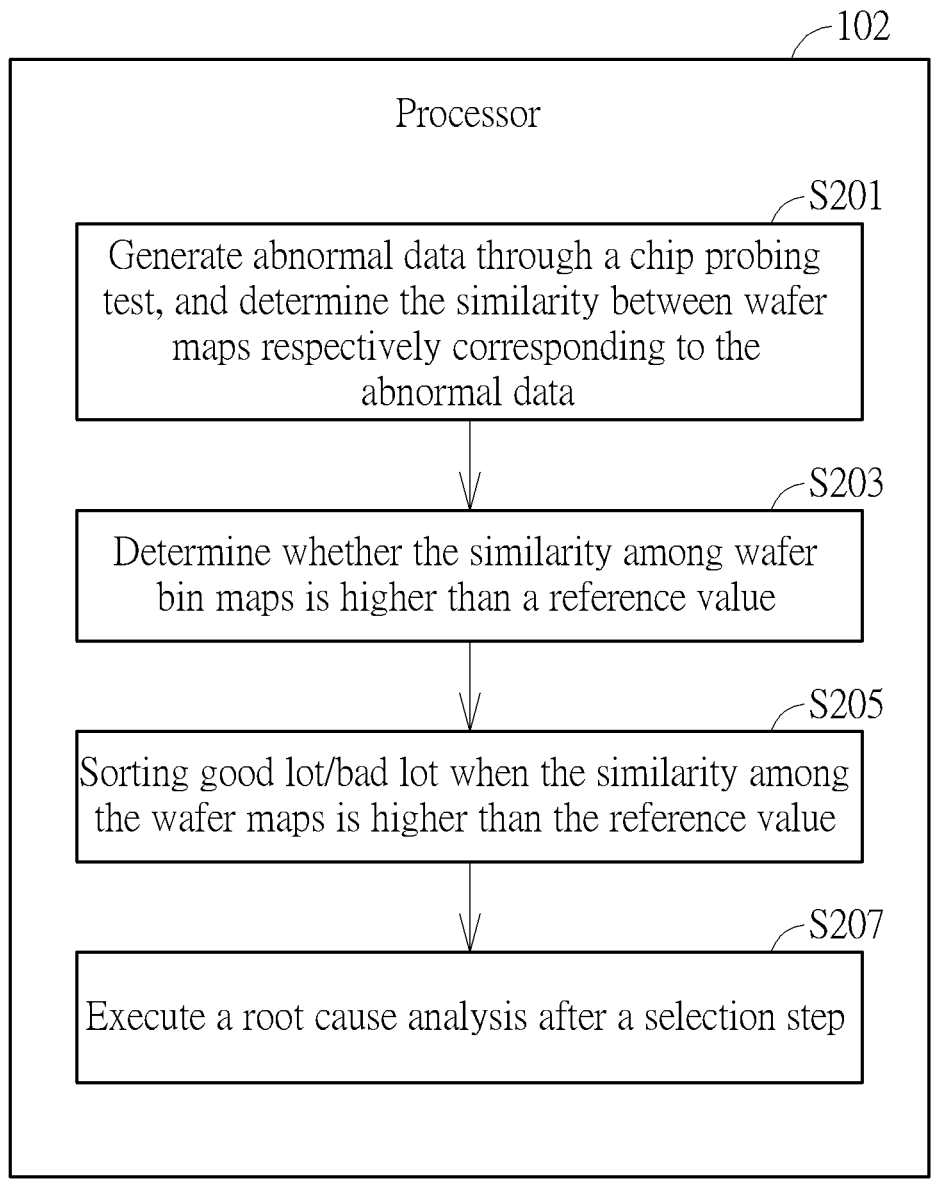
FIG. 5 is a flowchart illustrating a method for determining a cause of abnormality in a semiconductor manufacturing process according to one embodiment of the disclosure.

According to one embodiment of the present disclosure, a method for determining the cause of abnormality in a semiconductor manufacturing process is also provided. FIG. 5 is a flowchart illustrating a method for determining a cause of abnormality in a semiconductor manufacturing process according to one embodiment of the disclosure. Referring to FIG. 5, the processor 102 may be used to execute a step of determining the cause of abnormality in a semiconductor manufacturing process, which includes the steps of: executing step S201 to generate abnormal data through a chip probing test and determine the similarity between wafer maps respectively corresponding to the abnormal data; executing step S203 to determine whether the similarity among wafer bin maps is higher than a reference value; executing step S205 for sorting good lot/bad lots when the similarity among the wafer maps is higher than the reference value; executing step S207 to carry out a root cause analysis after the selection step.

Figure 6:
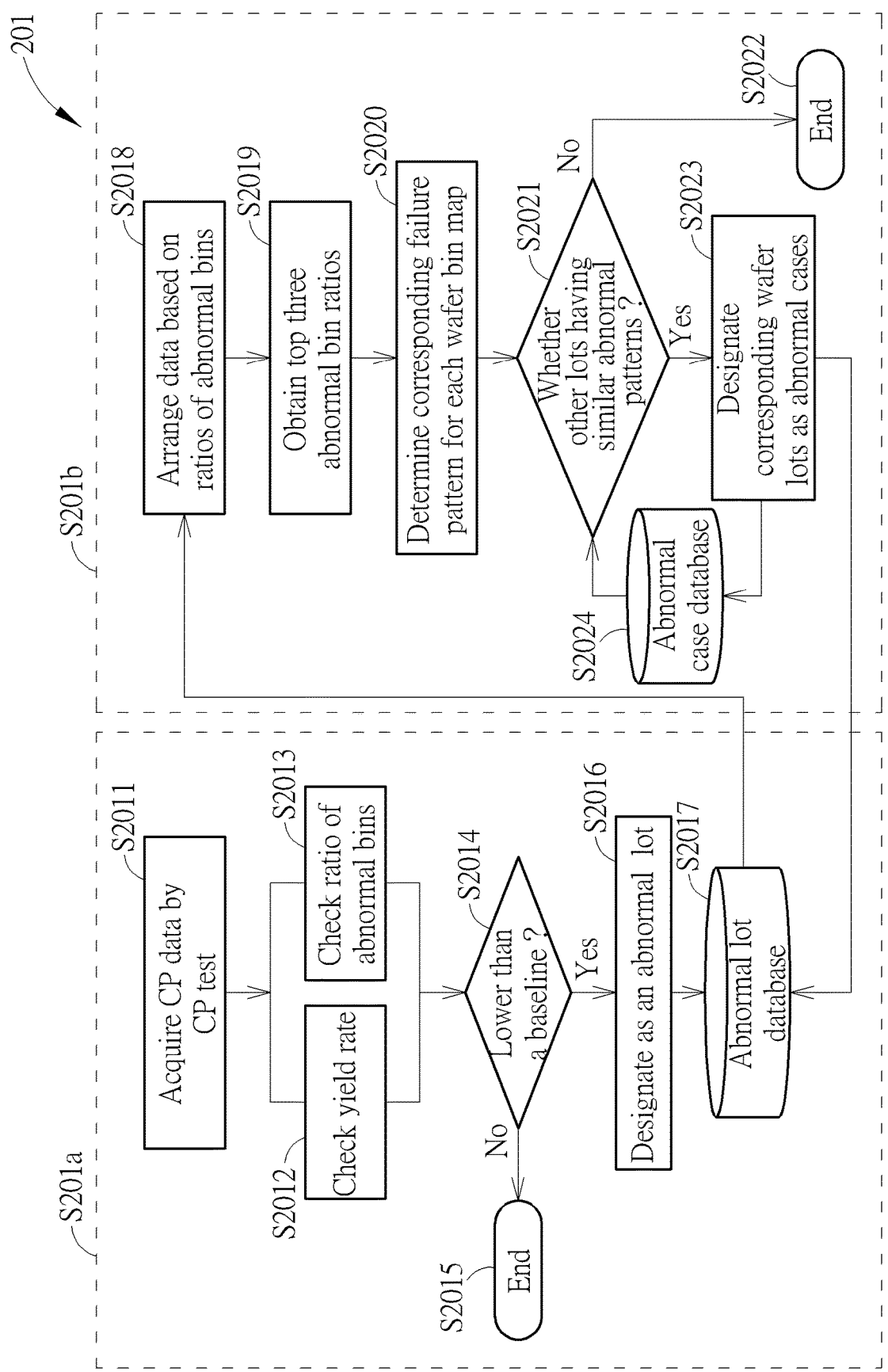
FIG. 6 is a flowchart illustrating a method for determining the similarity between wafer bin maps corresponding to abnormal data according to one embodiment of the present disclosure.

FIG. 6 is a flowchart illustrating a method for determining the similarity between wafer bin maps corresponding to abnormal data according to one embodiment of the present disclosure. Referring to FIG. 6, for step S201 disclosed above, step S201 may be executed by the processor, and step S201 may include an abnormal lot detection step S201a and an abnormal case detection step S201b. In the abnormal lot detection step S201a, step S2011 is first executed to acquire CP data generated from a process of circuit probing the wafer. Afterwards, steps S2012 and S2013 may be executed concurrently or sequentially to confirm the information of yield rate in the above CP data and confirm the information about the ratio between various types of the abnormal bins. Then, step S2014 is executed to determine whether the yield rate and/or the ratio between the abnormal bins of the wafers are lower than a baseline. When the yield rate and/or the ratio between the abnormal bins of the wafers are not lower than the baseline, it means that the wafer or wafer lot corresponding to the CP data are not abnormal. Thus, the abnormal lot detection step S201a may be ended by executing step S2015. In contrast, when the yield rate and/or the ratio between the abnormal bins of the wafers are lower than the baseline, it means that the wafer or wafer lot corresponding to the CP data is abnormal. The above baseline may be obtained through a machine learning process. Step S2016 is executed to designate the wafer or wafer lot corresponding to the CP data as abnormal wafer or abnormal wafer lot, and then step S2017 is executed to record the CP data in the database storing the excursion lots (e.g. an abnormal lot database). At this time, the abnormal lot detection step S201a is completed. Next, an abnormal case detection step S201b may be executed to determine whether the above-mentioned issue (e.g. abnormality) belongs to a systemic abnormal case. Specifically, step S2018 is first executed to retrieve data from the database storing the abnormal lots, and sort and arrange the data based on the difference between the abnormal bin ratio and the baseline. Next, step S2019 is executed to obtain top three abnormal bin ratios. Subsequently, based on the top three abnormal bin ratios, step S2020 may be executed to classify the corresponding abnormal wafers and determine the corresponding failure patterns of the wafer bin maps. Next, step S2021 is executed to determine whether other lots contain similar abnormal wafers. The judgment of the similarity among the abnormal wafers may be calculated using logistic regression. Factors, e.g. $x_1, x_2, x_3, x_4 \ldots n_x$, in equation (2) may respectively correspond to the sum of the abnormal bin ratios between two abnormal wafers, the subtraction of the abnormal bin ratios between two abnormal wafers, the distance between two overlapped abnormal wafer bin maps, and so forth, but not limited thereto. The term "bin ratio" may refer to the ratio of the number of dies with abnormal bins to the total number of the dies of the given wafer, and so forth, but not limited thereto. If other lots do not contain similar abnormal wafers, it means that the data being generated belongs to a single random abnormality. Thus, the abnormal case detection step S201b may be ended by executing step S2022. However, if other lots contain similar abnormal wafers, it means that the data belongs to a systematic abnormality, so step S2023 may be executed to designate the corresponding wafer lot as abnormal cases. For abnormal cases, in step S2024, the corresponding data may be recorded in the database storing abnormal cases. Thus, the data stored in the database may be used in step S2021 to determine whether other lots contain similar abnormal wafers. In addition, for the lots with abnormal cases, step S2017 may also be executed to store the corresponding data in the abnormal lot database.

Figure 7:
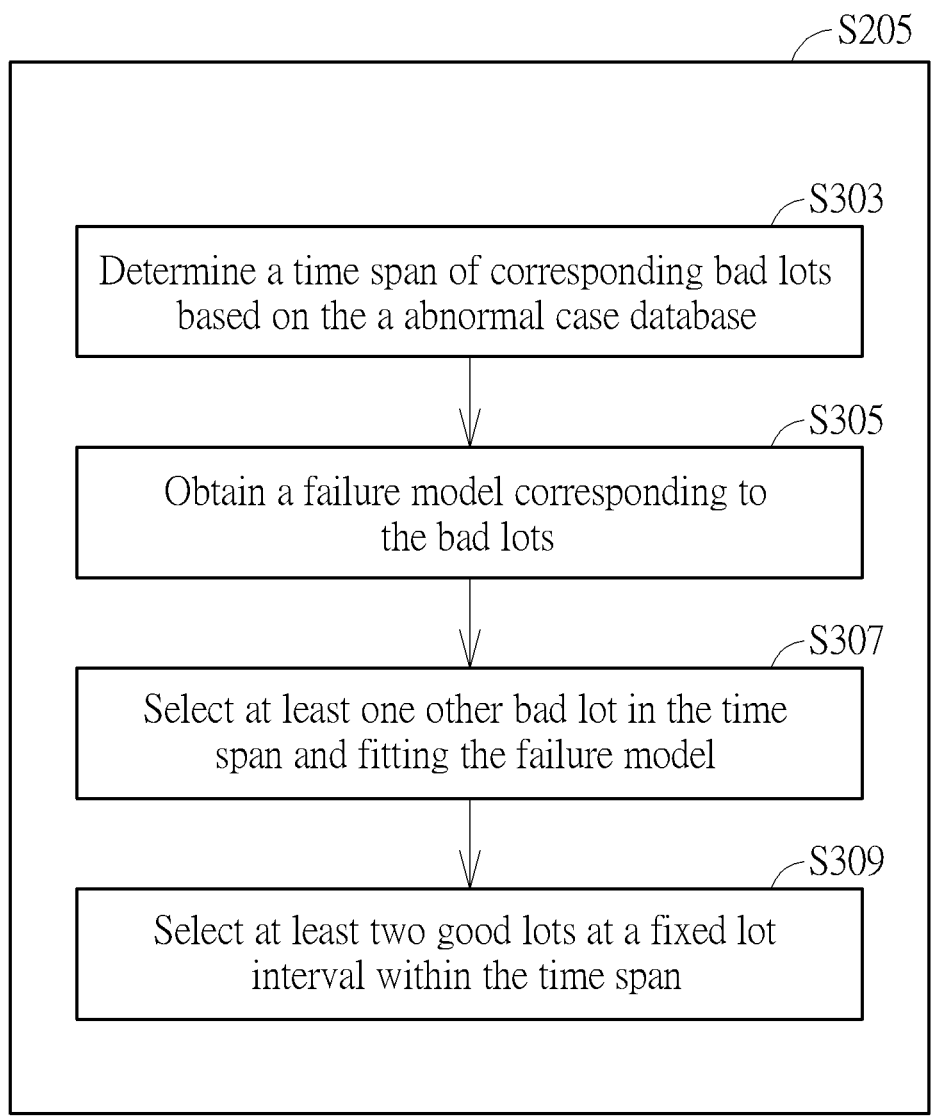
FIG. 7 is a flowchart illustrating a method for executing a selection step of sorting bad lots/good lots according to one embodiment of the disclosure.

FIG. 7 is a flowchart illustrating a method for executing a selection step of sorting bad lots/good lots according to one embodiment of the disclosure. Referring to FIG. 7, step S205 disclosed above may include multiple sub-steps. First, step S303 may be executed to determine a time span corresponding to the occurrence of the bad lots (i.e. the time span at which the abnormal data occur) based on the database storing data of excursion cases. Next, step S305 is executed to obtain a failure model corresponding to the bad lots. Then, step S309 is executed to select at least one other bad lot occurring in the time span and fitting the failure model. Then, step S309 is executed to select at least two good lots at a fixed lot interval within the time span (i.e. "the lots selected at a fixed lot interval" means that the number of the lots existing between the adjacent two selected lots is fixed at a given value). Steps, such as steps S303, S305, S307, and S309 described in the embodiment of FIG. 7 are substantially the same as steps, such as steps S303, S305, S307, and S309 described in the embodiment of FIG. 3, and the details of which are not disclosed herein for the sake of brevity.

Figure 8:
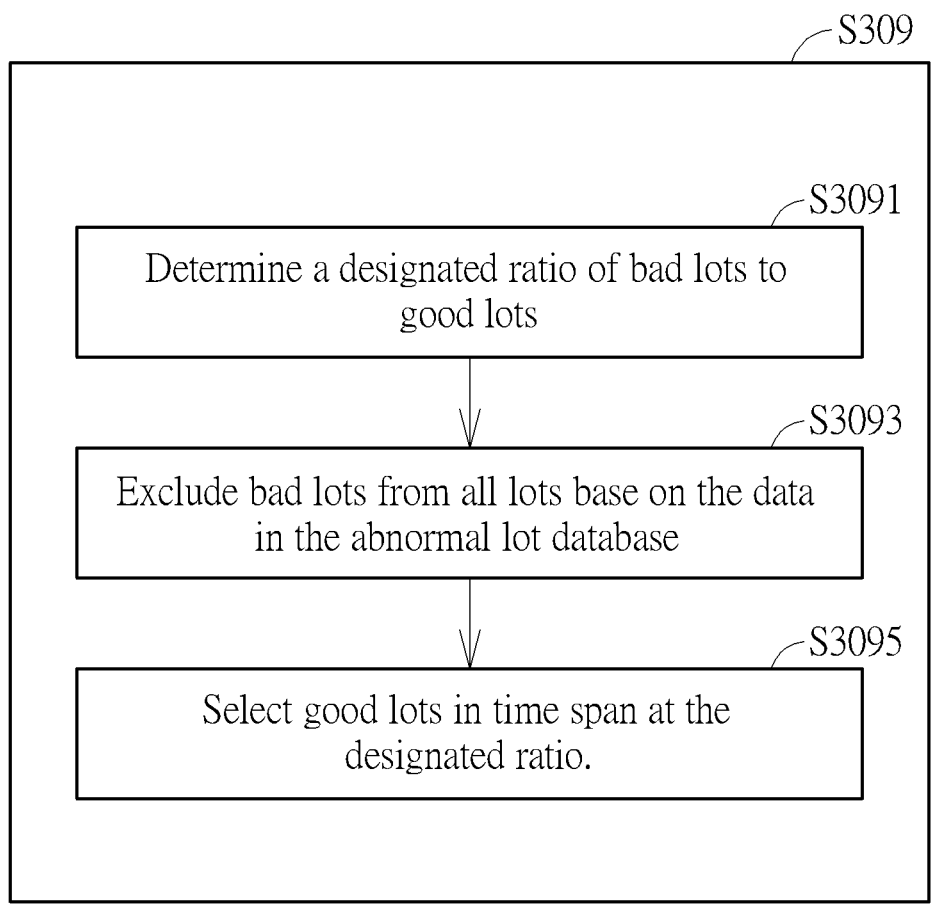
FIG. 8 is a flowchart illustrating a method for selecting good lots at a selected ratio according to one embodiment of the present disclosure.

FIG. 8 is a flowchart illustrating a method for selecting good lots at a selected ratio according to one embodiment of the present disclosure. Referring to FIG. 8, step S3091 may be executed to determine a designated ratio of bad lots to good lots. When the number of bad lots and the number of good lots fall within a certain ratio, for example, 1:3 to 1:4, it is more conducive to subsequent root cause analysis. In addition, when the total number of the selected bad lots and the total number of the selected good lots are higher, it is also more conducive to subsequent root cause analysis. Next, step S3093 is executed to exclude bad lots from all lots base on the data in the abnormal lot database. Next, step S3095 is executed to select good lots in the above-described time span at the designated ratio.

Figure 9:
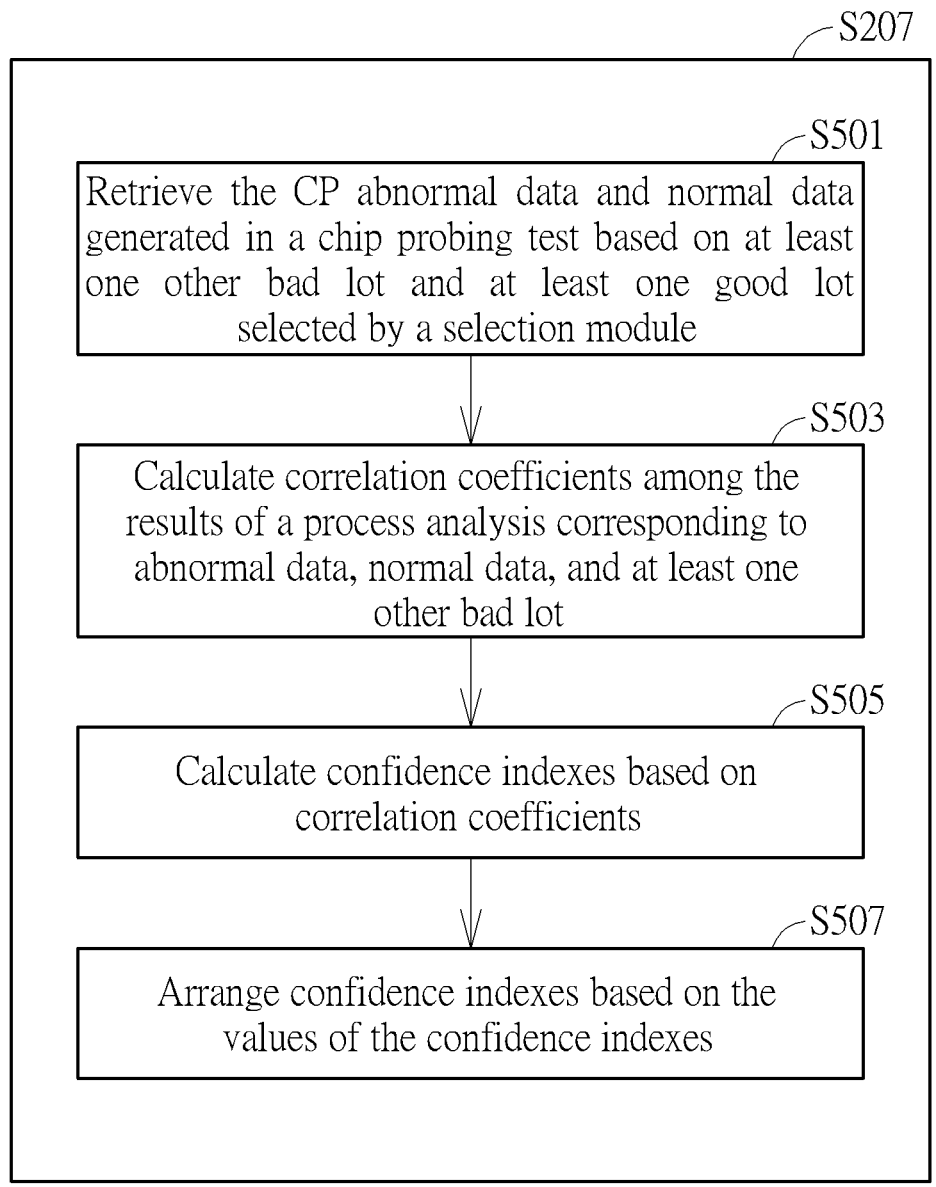
FIG. 9 is a flowchart illustrating a method for executing a step of root cause analysis according to one embodiment of the present disclosure.

FIG. 9 is a flowchart illustrating a method for executing a step of root cause analysis according to one embodiment of the present disclosure. Referring to FIG. 9, the above step S207 may include multiple sub-steps. First, step S501 may be executed to retrieve the CP abnormal data and normal data generated in a chip probing test based on the at least one further bad lot and the at least one good lot selected (or sorted) by the selection module. Next, step S503 is executed to calculate the correlation coefficients among the results of the process analysis corresponding to the CP abnormal data, the normal data, and the at least one other bad lot. Next, step S505 is executed to calculate the confidence indexes based on the correlation coefficients. Finally, step S507 is executed to sort and arrange the confidence indexes based on the values of the confidence indexes. Steps, such as steps S501, S503, S505, and S507 described in the embodiment of FIG. 9 are substantially the same as steps, such as steps S501, S503, S505, and S507 described in the embodiment of FIG. 4, and the details of which are not disclosed herein.

Figure 10:
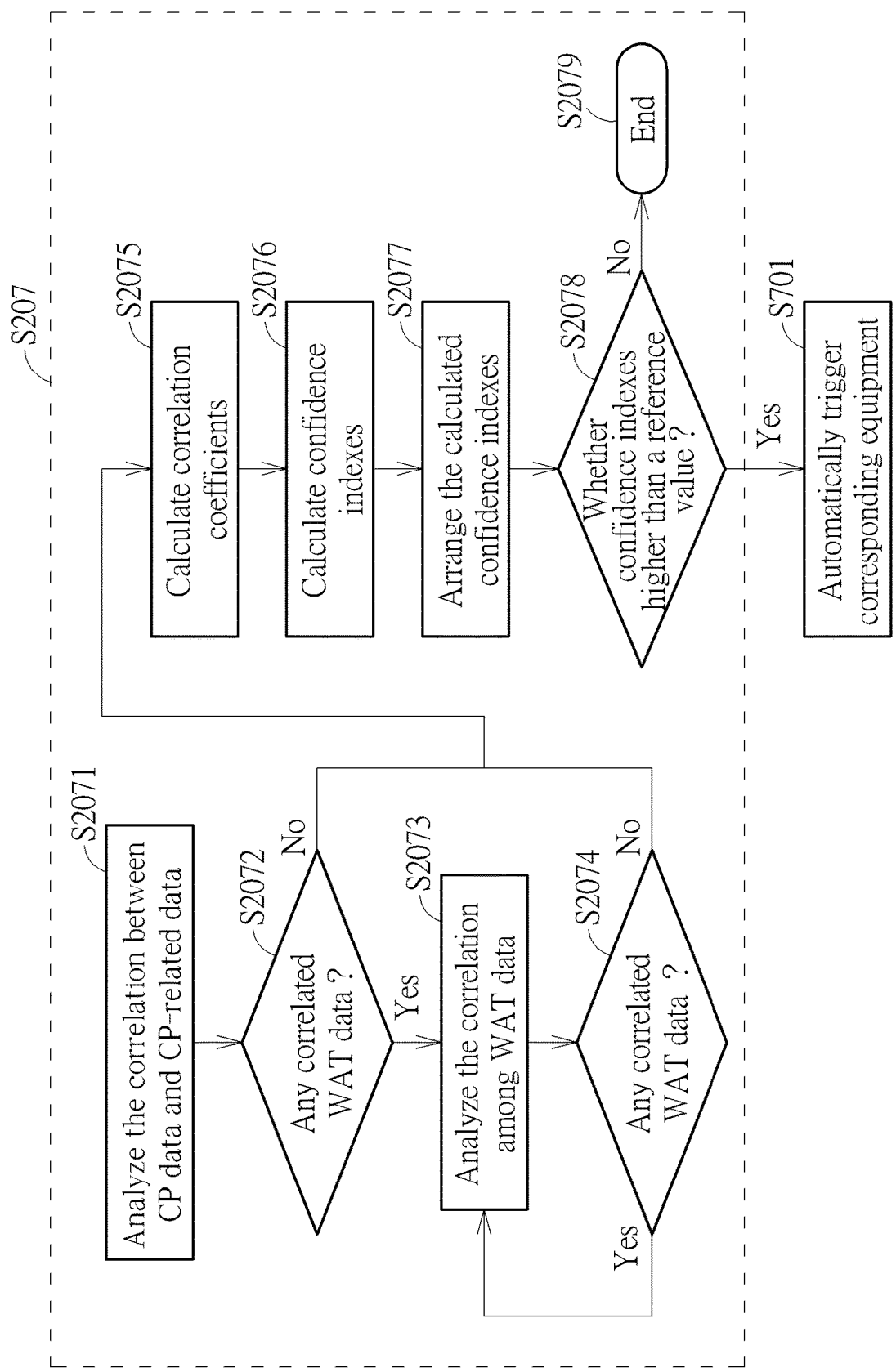
FIG. 10 is a flowchart illustrating a method for executing a step of root cause analysis according to another embodiment of the present disclosure.

The step S207 is not limited to the above sub-steps disclosed above and may include other multiple sub-steps. FIG. 10 is a flowchart illustrating a method for executing a step of root cause analysis according to another embodiment of the present disclosure. Referring to FIG. 10, in step S2071, the correlation between CP data and CP-related data may be analyzed. The executed analysis of step S2071 may include analyzing the correlation between CP data and CP-related data, analyzing the relationship between CP data and EQP data, analyzing the correlation between CP data and QC data, analyzing the relationship between CP data and RTM data, and so forth, but not limited thereto. Next, step S2072 is executed to confirm whether there is any relevant WAT data. In other words, step S2072 is executed to check if there are any WAT data that have a correlation with CP data. If yes, step S2073 is then executed to analyze the correlation between the WAT data and the WAT data. Then, step S2074 is executed to analyze whether there is any relevant WAT data in order to check if there are any WAT data that have a correlation with each other. If yes, step S2073 is then executed to continue to analyze the correlation between the WAT data and the WAT data. When the results of step S2072 and step S2074 are both negative, step S2075 may be executed to calculate multiple correlation coefficients. Subsequently, step S2076 is executed to calculate confidence indexes, and then step S2077 is executed to arrange or sort the calculated confidence indexes. Then, step S2078 is executed to determine whether there is a confidence indexes higher than a reference value. If not, it means that there is no existing equipment that could be obviously attributed as root cause equipment. Thus, step S2079 may be executed to end the root cause analysis step. If the result of step S2078 is yes, it means that there is existing equipment that could be obviously attributed as root cause equipment. Thus, step S701 may be further executed to automatically trigger the corresponding equipment, so that the corresponding equipment may execute actions such as automatic shutdown or automatic parameter adjustment. According to the embodiments of the present disclosure, by using the abnormal mode determination module, the selection module, and the root cause analysis module, the steps, such as the step of determining abnormality mode, the step of selecting good lots/bad lots, and the step of determining root causes, may be executed automatically. Thus, the following treatment may be triggered automatically. In other words, according to the embodiments of the present disclosure, the step of determining abnormality mode, the step of selecting good lots/bad lots, and the step of determining root causes may not be executed manually. As a result, the root cause of the abnormality in the semiconductor manufacturing process may be determined quickly, and the subsequent treatment may also be triggered automatically.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A system for determining a cause of abnormality in a semiconductor manufacturing process, comprising
    a determination module configured to record a plurality of abnormal data, determine a similarity between wafer maps respectively corresponding to the abnormal data, and determine whether the similarity between the wafer maps is higher than a reference value;
    a selection module, when the similarity between the wafer maps is higher than the reference value, the selection module executes the steps of:
        determining at least two bad lots based on the wafer maps with the similarity higher than the reference value;
        determining a time span within which the at least two bad lots are generated;
        acquiring a failure module corresponding to the at least two bad lots;
        selecting at least one further bad lot occurring in the time span and satisfying the failure model; and
        selecting at least two good lots based on a fixed lot interval in the time span; and a root cause analysis module, executing the steps of:
  retrieving a plurality of corresponding abnormal data from a database based on the at least one further bad lot and the at least two good lots selected by the selection module;
  calculating a plurality of correlation coefficients based on the relationship between the abnormal data and a plurality of results of process analysis corresponding to the at least one further bad lot;
  calculating a plurality of confidence indexes based on the correlation coefficients; and
  arranging the confidence indexes in an order based on numerical values of the confidence indexes.

2. The system for determining the cause of the abnormality in the semiconductor manufacturing process of claim 1, wherein the wafer maps comprise an identical failure pattern when the similarity between the wafer maps is higher than the reference value.

3. The system for determining the cause of the abnormality in the semiconductor manufacturing process of claim 1, wherein one of the at least two bad lots is a first bad lot, and another one of the at least two bad lots is a last bad lot, and the step of determining the time span within which the at least two bad lots are generated comprises: calculating the time span based on time points at which the first bad lot and the last bad lot are generated respectively.

4. The system for determining the cause of the abnormality in the semiconductor manufacturing process of claim 1, wherein the failure model is determined based on a spatial distribution of the failure pattern or a type of a failure bin of each of the wafer maps.

5. The system for determining the cause of the abnormality in the semiconductor manufacturing process of claim 1, wherein a quantity ratio of the at least one further bad lot to the at least one good lot is 1:3 to 1:4.

6. The system for determining the cause of abnormality in the semiconductor manufacturing process of claim 1, after the step of arranging the confidence indexes in order, wherein a process equipment designated by top-ranking confidence indexes is a process equipment incurring the root cause.

7. The system for determining the cause of abnormality in the semiconductor manufacturing process of claim 6, further comprising an automatic trigger module executing the steps of: transmitting a signal to the process equipment incurring the root cause in order to cause the process equipment to stop or automatically adjust processing parameters based on the signal.

8. The system for determining the abnormality of the semiconductor manufacturing process of claim 1, wherein the determination module determines the abnormal data based on an electrical measurement and/or an optical measurement.

9. The system for determining the cause of the abnormality in the semiconductor manufacturing process of claim 1, wherein the confidence indexes and the similarity between the wafer maps are calculated based on a result of a logistic regression.

10. The system for determining the cause of the abnormality in the semiconductor manufacturing process of claim 1, wherein the wafer maps are wafer bin maps or wafer particle maps.

11. A method for determining a cause of abnormality in a semiconductor manufacturing process, comprising:
  using a plurality of abnormal data acquired in a measurement to determining a similarity between wafer maps respectively corresponding to the abnormal data;
  determining whether the similarity between the wafer maps is higher than a reference value;
  executing a selection step for sorting good lot/bad lots when the similarity between the wafer maps is higher than the reference value, wherein the selection step comprises the steps of:
    determining a time span within which the at least two bad lots are generated;
    acquiring a failure module corresponding to the at least two bad lots;
    selecting at least one further bad lot occurring in the time span and satisfying the failure model; and
    selecting at least two good lots based on a fixed lot interval in the time span; and
  executing a root cause analysis step after the selection step, wherein the root cause analysis step comprises the steps of:
    retrieving a plurality of corresponding abnormal data from a database based on the at least one further bad lot and the at least two good lots selected by the selection module;
    calculating a plurality of correlation coefficients based on the relationship between the abnormal data and a plurality of process analysis results corresponding to the at least one further bad lot;
    calculating a plurality of confidence indexes based on the correlation coefficients; and
    arranging the confidence indexes in an order based on numerical values of the confidence indexes.

12. The method for determining the abnormality in the semiconductor manufacturing process of claim 11, wherein the abnormal data comprises a yield of wafers or a ratio between different bins.

13. The method for determining the cause of abnormality in semiconductor manufacturing processes of claim 11, wherein the step of determining the similarity between the wafer maps comprises: determining a ratio between different bins corresponding to each of the wafer maps and a spatial distribution corresponding to each of the wafer maps.

14. The method for determining the cause of the abnormality in the semiconductor manufacturing process of claim 11, wherein the wafer maps comprise an identical failure pattern when the similarity between the wafer maps is higher than the reference value.

15. The method for determining the cause of the abnormality in the semiconductor manufacturing process according to claim 11, wherein one of the at least two bad lots is a first bad lot, and another one of the at least two bad lots is a last bad lot, and the step of determining the time span within which the at least two bad lots are generated comprises: calculating the time span based on time points at which the first bad lot and the last bad lot are generated respectively.

16. The method for determining the cause of the abnormality in the semiconductor manufacturing process of claim 11, wherein the failure model is determined based on a spatial distribution of the failure pattern or a type of a failure bin of each of the wafer maps.

17. The method for determining the cause of the abnormality in the semiconductor manufacturing process of claim 11, wherein a quantity ratio of the at least one further bad lot to the at least one good lot is 1:3 to 1:4.

18. The method for determining the cause of the abnormality in the semiconductor manufacturing process of claim 11, wherein the determination module determines the abnormal data based on an electrical measurement and/or an optical measurement.

19. The method for determining the cause of the abnormality in the semiconductor manufacturing process of claim 11, wherein the confidence indexes and the similarity between the wafer maps are calculated based on a result of a logistic regression.

20. The method for determining the cause of the abnormality in the semiconductor manufacturing process of claim 11, wherein the wafer maps are wafer bin maps or wafer particle maps.

* * * * *